US012751069B2

(12) United States Patent
Lv

(10) Patent No.: US 12,751,069 B2
(45) Date of Patent: Sep. 29, 2026

(54) MANUFACTURING METHOD OF SEMICONDUCTOR STRUCTURE AND SEMICONDUCTOR STRUCTURE

(71) Applicants: CHANGXIN MEMORY TECHNOLOGIES, INC., Hefei City (CN); CHANGXIN JIDIAN (BEIJING) MEMORY TECHNOLOGIES CO., LTD., Beijing (CN)

(72) Inventor: Zhaohong Lv, Hefei City (CN)

(73) Assignees: CHANGXIN MEMORY TECHNOLOGIES, INC., Hefei City (CN); CHANGXIN JIDIAN (BEIJING) MEMORY TECHNOLOGIES CO., LTD., Beijing (CN)

( * ) Notice: Subject to any disclaimer, the term of this patent is extended or adjusted under 35 U.S.C. 154(b) by 804 days.

(21) Appl. No.: 17/935,616

(22) Filed: Sep. 27, 2022

(65) Prior Publication Data

US 2023/0361187 A1 Nov. 9, 2023

(30) Foreign Application Priority Data

May 5, 2022 (CN) ......................... 202210477822.3

(51) Int. Cl.
*H10D 64/27* (2025.01)
*H10D 30/01* (2025.01)
(Continued)

(52) U.S. Cl.
CPC ....... *H10D 64/516* (2025.01); *H10D 30/0227* (2025.01); *H10D 30/605* (2025.01); *H10D 64/683* (2025.01); *H10D 64/693* (2025.01)

(58) Field of Classification Search
CPC . H10D 64/514–519; H10D 64/68–693; H10D 30/605; H10D 30/0227;
(Continued)

(56) References Cited

U.S. PATENT DOCUMENTS 5,798,550 A * 8/1998 Kuroyanagi ......... H10D 30/665 257/341
6,297,106 B1 * 10/2001 Pan ...................... H10D 64/671 257/E29.162
(Continued)

FOREIGN PATENT DOCUMENTS

CN 103730343 A 4/2014
CN 104681442 A 6/2015
CN 105845577 A 8/2016

OTHER PUBLICATIONS

Lenka, Trupti & Panda, Ajit. (2012). AlGaN/GaN-based HEMT on SiC substrate for microwave characteristics using different passivation layers. Pramana. 79. 10.1007/ (Year: 2012).*
(Continued)

*Primary Examiner* — Julio J Maldonado
*Assistant Examiner* — Eric Manuel Mulero Flores
(74) *Attorney, Agent, or Firm* — Syncoda LLC; Feng Ma

(57) ABSTRACT

The present disclosure relates to the technical field of semiconductors, and provides a manufacturing method of a semiconductor structure and a semiconductor structure. The substrate comprises an active region, and the active region is provided with a source region of a first doping type and a drain region of the first doping type; the first dielectric layer is at least partially provided on the substrate and covers a part of the source region and/or a part of the drain region; the second dielectric layer is provided on the substrate, the first dielectric layer is connected to the second dielectric layer, and a thickness of the second dielectric layer is less than a thickness of the first dielectric layer; orthographic
(Continued)

projection of the gate structure on the substrate covers orthographic projection of the second dielectric layer and orthographic projection of the first dielectric layer on the substrate.

17 Claims, 5 Drawing Sheets

(51) Int. Cl.
*H10D 30/60* (2025.01)
*H10D 64/68* (2025.01)

(58) Field of Classification Search
CPC .. H10D 30/60; H10D 30/657; H10D 30/6715; H10D 30/6719; H10D 64/021; H10D 64/675; H10D 30/603; H10D 30/01–877; H10D 30/0223; H10D 30/601; H10D 30/0198; H10D 84/0144; H10D 84/0181; H10D 84/8314
See application file for complete search history.

(56) References Cited

U.S. PATENT DOCUMENTS

| | | | | |
|---|---|---|---|---|
| 6,888,198 | B1 * | 5/2005 | Krivokapic | H10D 30/6739 257/E29.151 |
| 2002/0163039 | A1 | 11/2002 | Radens et al. | |
| 2005/0087775 | A1 | 4/2005 | Chen et al. | |
| 2007/0018238 | A1 * | 1/2007 | Ono | H10D 64/685 257/327 |
| 2007/0069285 | A1 * | 3/2007 | Takami | H10D 64/671 257/E29.152 |
| 2012/0056270 | A1 * | 3/2012 | Fujita | H10D 64/514 257/369 |
| 2015/0287797 | A1 * | 10/2015 | Yu | H10D 64/516 438/305 |

OTHER PUBLICATIONS

CN first office action in application No. 202210477822.3, mailed on Jul. 10, 2026.

* cited by examiner

MANUFACTURING METHOD OF SEMICONDUCTOR STRUCTURE AND SEMICONDUCTOR STRUCTURE

CROSS-REFERENCE TO RELATED APPLICATION

This disclosure claims the priority of Chinese Patent Application No. 202210477822.3, submitted to the Chinese Intellectual Property Office on May 5, 2022, the disclosure of which is incorporated herein in its entirety by reference.

TECHNICAL FIELD

The present disclosure relates to the technical field of semiconductors, and in particular, to a manufacturing method of a semiconductor structure and a semiconductor structure.

BACKGROUND

The dynamic random access memory (DRAM) has advantages of a small size, a high degree of integration, and low power consumption, and the access speed of the DRAM chip is faster than that of the read-only memory (ROM).

In the DRAM chip, the minimum chip read time is one of the core indicators of the DRAM chip, which reflects the response time of the DRAM chip, i.e., the time from the moment when the DRAM chip receives a read command from a controller to the moment when the DRAM chip outputs read data to the controller, and a smaller value of the time is preferred. The time is related to many electrical parameters in the semiconductor structure of the core circuitry in the DRAM chip. For example, when the overlapping region between the gate structure and the source region of the active region in the semiconductor structure, and the overlapping region between the gate structure and the drain region of the active region have smaller parasitic capacitance, the minimum read time of chip data is shorter.

If the area of the overlapping region between the gate structure and the source-drain region of the active region is reduced, the corresponding parasitic capacitance can be reduced. However, this also brings many negative effects, such as the gate induced drain leakage (GIDL), which decreases the electrical performance of the semiconductor structure.

SUMMARY

A first aspect of the present disclosure provides a semiconductor structure, including:

- a substrate, where the substrate comprises an active region, and the active region is provided with a source region of a first doping type and a drain region of the first doping type;
- a first dielectric layer, where the first dielectric layer is at least partially provided on the substrate, and covers a part of the source region and/or a part of the drain region;
- a second dielectric layer, where the second dielectric layer is provided on the substrate, the first dielectric layer is connected to the second dielectric layer, and a thickness of the second dielectric layer is less than a thickness of the first dielectric layer; and
- a gate structure, where orthographic projection of the gate structure on the substrate covers orthographic projection of the second dielectric layer and orthographic projection of the first dielectric layer on the substrate.

A second aspect of the present disclosure provides a manufacturing method of a semiconductor structure, including:

- providing a substrate, where the substrate comprises an active region;
- forming a first intermediate dielectric layer, where the first intermediate dielectric layer has an opening, and the opening exposes a part of a top surface of the substrate;
- forming a second dielectric layer in the opening, where the first intermediate dielectric layer is connected to the second dielectric layer, and a thickness of the second dielectric layer is less than a thickness of the first intermediate dielectric layer;
- forming a gate structure, where orthographic projection of the gate structure on the substrate covers orthographic projection of the second dielectric layer and orthographic projection of a part of the first intermediate dielectric layer on the substrate;
- removing a part of the first intermediate dielectric layer not covered by the gate structure, where the retained first intermediate dielectric layer forms a first dielectric layer; and
- forming a source region of a first doping type and a drain region of the first doping type in the active region, where the first dielectric layer is formed on a part of the source region and/or a part of the drain region, and the second dielectric layer is connected to a side of the first dielectric layer that is away from the source region and/or the drain region.

BRIEF DESCRIPTION OF THE DRAWINGS

The accompanying drawings incorporated into the specification and constituting part of the specification illustrate the embodiments of the present disclosure, and are used together with the description to explain the principles of the embodiments of the present disclosure. In these accompanying drawings, similar reference numerals represent similar elements. The accompanying drawings in the following description illustrate some rather than all of the embodiments of the present disclosure. Those skilled in the art may obtain other accompanying drawings based on these accompanying drawings without creative efforts.

DETAILED DESCRIPTION

To make the objectives, technical solutions, and advantages of the embodiments of the present disclosure clearer, the following clearly and completely describes the technical solutions in the embodiments of the present disclosure with reference to the accompanying drawings in the embodiments of the present disclosure. Apparently, the described embodiments are some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

According to an exemplary embodiment, this embodiment provides a semiconductor structure. The semiconductor structure is illustrated below with reference to FIG. 1.

The semiconductor structure is not limited in this embodiment. The semiconductor structure being a transistor in a core region of a DRAM is used as an example below for description, but this embodiment is not limited thereto. Alternatively, the semiconductor structure in this embodiment may be other structures.

Figure 1:
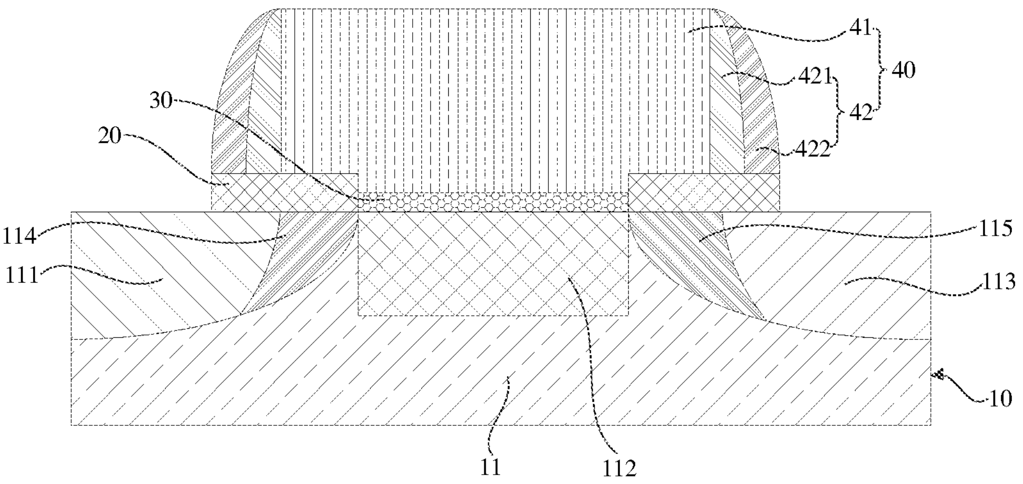
FIG. 1 is a schematic diagram of a semiconductor structure according to an exemplary embodiment.
Figure 2:
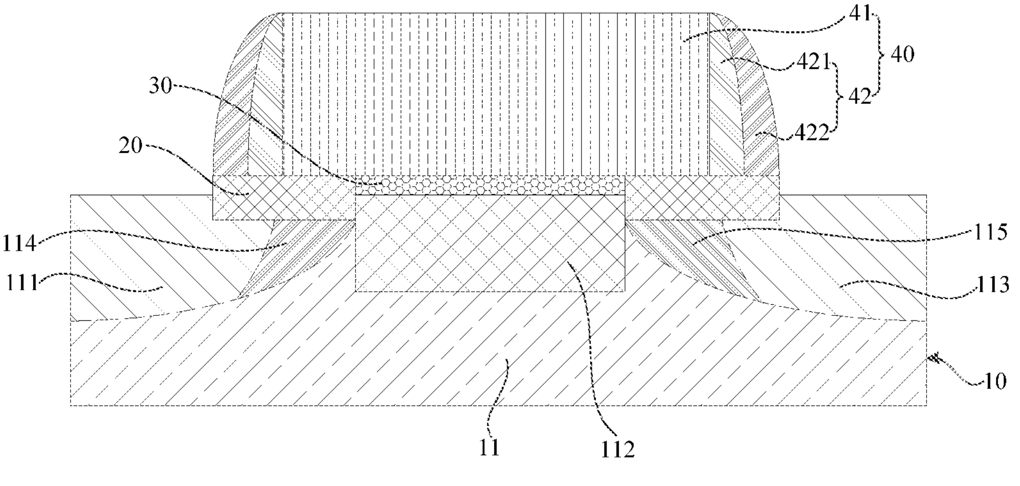
FIG. 2 is a schematic diagram of a semiconductor structure according to an exemplary embodiment.

As shown in FIG. 1 and FIG. 2, the semiconductor structure in this embodiment includes: a substrate 10, a first dielectric layer 20, a second dielectric layer 30, and a gate structure 40.

The substrate 10 is used as a support component of the DRAM to support other components provided thereon. For example, the substrate 10 may be provided with structures such as a word line structure and a bit line structure. The substrate 10 may be made of a semiconductor material. The semiconductor material may be one or more of silicon, germanium, a silicon-germanium compound, and a silicon-carbon compound. In this embodiment, the substrate 10 is made of a silicon material. The use of the silicon material as the substrate 10 in this embodiment is to facilitate the understanding of the subsequent forming method by those skilled in the art, rather than to constitute a limitation.

The substrate 10 comprises an active region 11, and the active region 11 is provided with a source region 111 of a first doping type and a drain region 113 of the first doping type. The substrate 10 may be a P-type substrate, and doping of a first type is subsequently formed on part of the substrate 10, to form the source region 111 and the drain region 113. For example, N-type doping is performed on the source region 111 and the drain region 113 to form an NMOS. For example, the source region 111 and the drain region 113 may be doped with an N-type doping material, such that the source region 111 and the drain region 113 form an N-type semiconductor. The N-type doping material may be an element in the IV main group of the periodic table, for example, phosphorus (P), or certainly, may be a material of other elements, which are not listed herein. In an example, phosphorus ions may be implanted to the source region 111 and the drain region 113 through ion implantation. Certainly, the source region 111 and/or the drain region 113 may also be doped by other processes, which is not specifically limited.

Referring to FIG. 1 and FIG. 2, the substrate 10 further includes a channel region 112 of a second doping type. The channel region 112 can allow a current to flow, and the current in the channel region 112 is controlled by the electrical potential of the gate structure 40, to implement a gate control function. The channel region 112 is located below the gate structure 40, and two ends of the channel region 112 are connected to the source region 111 and the drain region 113 respectively, and the second dielectric layer 30 covers the channel region 112.

The second doping type and the first doping type have different dopant ions, or the second doping type and the first doping type have opposite dopant ions. The opposite doping ions can be understood as doping P-type ions and N-type ions, i.e., doping P-type ions and N-type ions corresponding to group III and group V elements. Whether ions of the first doping type are P-type ions or N-type ions is consistent with the nature of the field effect transistor. That is, for the NMOS, the first doping type corresponds to N-type ions, and for the PMOS, the first doping type corresponds to P-type ions.

Specifically, when the substrate 10 is a P-type silicon substrate, N-type ions (phosphorus (P) ions, arsenic (As) ions, or ions of other group V elements) are implanted into the silicon substrate to form the active region 11. Ions of the first doping type are N-type ions, and ions of the second doping type are P-type ions (boron (B) ions, gallium (Ga) ions, or ions of other group III elements).

When the substrate 10 is an N-type silicon substrate, P-type ions (boron (B) ions, gallium (Ga) ions, or ions of other group III elements) are implanted into the silicon substrate to form the active region 11. Ions of the first doping type are P-type ions, and ions of the second doping type are N-type ions (phosphorus (P) ions, arsenic (As) ions, or ions of other group V elements).

As shown in FIG. 1 and FIG. 2, at least part of the first dielectric layer 20 is provided on a part of the source region 111 and/or a part of the drain region 113. The sidewall at a side of the first dielectric layer 20 is flush with an external sidewall of the channel region 112 的 external sidewall. That is, the first dielectric layer 20 covers a part of the source region 111 and/or a part of the drain region 113 at two sides of the channel region 112.

The second dielectric layer 30 is provided on the channel region 112. The first dielectric layer 20 is connected to the second dielectric layer 30, and a thickness of the second dielectric layer 30 is less than a thickness of the first dielectric layer 20.

The gate structure 40 covers a top surface of the second dielectric layer 30 and a top surface of the first dielectric layer 20. As shown in FIG. 1, with a plane parallel to the top surface of the substrate 10 as a cross section, a projection area of the cross section of the gate structure 40 on the substrate 10 is larger than a projection area of the cross section of the second dielectric layer 30 on the substrate 10, where the edge of orthographic projection of the cross section of the gate structure 40 on the substrate 10 covers the top surface of the first dielectric layer 20.

The calculation formula of plate capacitance is: C=εS/d, where the unit of the capacitance value C is F, ε is the dielectric constant of the dielectric layer, S is an area of the overlapping region between the gate structure and the source region or an area of the overlapping region between the gate structure and the drain region, and d is a vertical distance between the gate structure and the source region or between the gate structure and the drain region. Because the thickness of the second dielectric layer 30 is less than the thickness of the first dielectric layer 20, when the area S of the overlapping region and the dielectric constant remain unchanged, the capacitance value of the overlapping region between the gate structure 40 and the source region 111, and/or the capacitance value of the overlapping region between the gate structure 40 and the drain region 113 will be reduced.

In this embodiment, the dielectric layer of the overlapping region between the gate structure and the source region and/or the dielectric layer of the overlapping region between the gate structure and the drain region is divided into a first dielectric layer and a second dielectric layer connected to each other. The first dielectric layer covers a part of the source region and/or a part of the drain region. The second dielectric layer is provided on the channel region, and the gate structure covers the second dielectric layer and the first dielectric layer. A thickness of the second dielectric layer is less than a thickness of the first dielectric layer, thereby effectively reducing the parasitic capacitance of the overlapping region between the gate structure and the source region, and/or the overlapping region between the gate structure and the drain region, shortening the minimum data read time of the semiconductor structure, and improving the electrical performance of the semiconductor structure.

In some embodiments, as shown in FIG. 1 and FIG. 2, the substrate 10 further includes a first source sub-region 114 of the first doping type and/or a first drain sub-region 115 of the first doping type. The first source sub-region 114 is located at a side of the source region 111 and is close to the drain region 113; the first drain sub-region 115 is located at a side of the drain region 113 and is close to the source region 111. A dopant ion concentration of the first source sub-region 114 is less than a dopant ion concentration of the source region 111, and a dopant ion concentration of the first drain sub-region 115 is less than a dopant ion concentration of the drain region 113. The first source sub-region 114 is located between the source region 111 and the channel region 112. The first source sub-region 114 can effectively weaken the electric field of the source region 111 and alleviate the thermo-electronic degradation of the source region 111. Similarly, the first drain sub-region 115 is located between the drain region 113 and the channel region 112. The first drain sub-region 115 can effectively weaken the electric field of the drain region 113 and alleviate the thermo-electronic degradation of the drain region 113.

In this embodiment, the first source sub-region and/or the first drain sub-region can effectively reduce the leakage current caused by the thermo-electronic degradation between the source region and/or drain region and the gate structure, thereby ensuring the stability of the transistor structure.

In some embodiments, as shown in FIG. 1 and FIG. 2, the thickness of the first dielectric layer 20 is 3.2 nm to 4.0 nm. For example, the thickness of the first dielectric layer 20 may be 3.2 nm, 3.4 nm, 3.5 nm, 3.8 nm, 4.0 nm or the like. The first dielectric layer 20 with such a thickness can implement good insulation effect between the gate structure 40 and the active region 11 and alleviate the GIDL of the semiconductor structure, to effectively ensure the electrical performance and yield of the semiconductor structure.

In some embodiments, as shown in FIG. 1, the thickness of the second dielectric layer 30 is 2.5 nm to 3.1 nm. For example, the thickness of the second dielectric layer 30 may be 2.5 nm, 2.7 nm, 2.8 nm, 3.0 nm, 3.1 nm or the like. The second dielectric layer 30 with such a thickness can occupy a smaller space and also ensure an insulation effect between the gate structure 40 and the active region 11, thereby ensuring the electrical performance and yield of the semiconductor structure.

In an example, the thickness D1 of the first dielectric layer 20 is 3.5 nm, and the thickness D2 of the second dielectric layer 30 is 3.0 nm. According to the calculation formula of the plate capacitance, in a case that the area S of the overlapping region remains unchanged and the dielectric constant is the same, along the direction perpendicular to the top surface of the substrate 10, the electric field of the overlapping region between the gate structure 40 and the source region 111 and between the gate structure 40 and the drain region 113 will be reduced. According to the following formula: (1−D2/D1)×100%, the vertical electric field of the overlapping region will be reduced by 14.3%, thereby effectively alleviating the GIDL effect of the semiconductor structure and improving the electrical performance and yield of the semiconductor structure.

In some embodiments, as shown in FIG. 1 and FIG. 2, the dielectric constant of the second dielectric layer 30 is greater than or equal to 3.9, and the dielectric constant of the first dielectric layer 20 is less than 3. In other words, the first dielectric layer 20 and the second dielectric layer 30 may have different dielectric constants. For example, the thickness D2 of the second dielectric layer 30 is 3.0 nm, and the second dielectric layer 30 is made of silicon dioxide ($SiO_2$); the thickness D1 of the first dielectric layer 20 is 3.5 nm, and the first dielectric layer 20 is made of a material with a low dielectric constant. The dielectric constant of the silicon dioxide material of the second dielectric layer 30 is K2, and K2 has a value of 3.9. The dielectric constant of the first dielectric layer 20 is K1, and the first dielectric layer 20 is made of a low-dielectric-constant material having a dielectric constant of 3, that is, K1 has a value of 3. According to the calculation formula of the plate capacitance, in a case that the area S of the overlapping region remains unchanged, it can be learned that the parasitic capacitance of the overlapping region between the gate structure 40 and the source region 111, and/or the parasitic capacitance of the overlapping region between the gate structure 40 and the drain region 113 is reduced. Compared with the parasitic capacitance in the prior art which is calculated according to the following formula: (1−K1/K2)×100%, the parasitic capacitance above will be reduced by 23.1%, thereby effectively shortening the minimum data read time of the semiconductor structure and improving the electrical performance of the semiconductor structure.

In some embodiments, as shown in FIG. 1, the first dielectric layer 20 is provided on the substrate 10, where the bottom of the first dielectric layer 20 is flush with the bottom of the second dielectric layer 30, and the top of the first dielectric layer 20 is higher than the top of the second dielectric layer 30.

In this embodiment, the thickness of the second dielectric layer is less than the thickness of the first dielectric layer, which can reduce the parasitic capacitance of the overlapping region between the gate structure and the source region and/or the overlapping region between the gate structure and the drain region, thereby shortening the minimum data read time of the semiconductor structure and improving the electrical performance of the semiconductor structure.

In some embodiments, as shown in FIG. 2, the first dielectric layer 20 is partially provided on the substrate 10, the top of the first dielectric layer 20 is flush with the top of the second dielectric layer 30, and the bottom of the first dielectric layer 20 is lower than the bottom of the second dielectric layer 30.

In this embodiment, the first dielectric layer is partially embedded in the substrate, which can reduce the height of the subsequently formed gate structure, thereby improving the spatial utilization of the semiconductor structure. Moreover, the first dielectric layer is made of a material with a low dielectric constant, which produces a stress effect on the channel region 112, thereby improving the electrical performance of the semiconductor structure. For example, for the NMOS, the tensile stress can improve the migration rate of electrons; for the PMOS, the pressure stress can improve the migration rate of holes. Meanwhile, the thickness of the first dielectric layer is greater than the thickness of the second dielectric layer, which can reduce the parasitic capacitance of the overlapping region between the gate structure and the source region and/or the overlapping region between the gate structure and the drain region, thereby shortening the minimum data read time of the semiconductor structure and improving the electrical performance of the semiconductor structure.

In some embodiments, as shown in FIG. 1 and FIG. 2, the gate structure 40 includes a gate layer 41 and a protective structure 42.

The gate layer 41 is provided on the second dielectric layer 30. Along a length direction of the substrate 10, projection of the gate layer 41 on the substrate 10 has an overlapping region with projection of the first dielectric layer 20 on the substrate. That is, two ends of the gate layer 41 further cover the top surface of part of the first dielectric layer 20.

The protective structure 42 is arranged at both sides of the gate layer 41 and covers side surfaces of the gate layer 41. The outer edge of the protective structure 42 is flush with the outer edge of the first dielectric layer 20.

In this embodiment, the gate layer may be configured to form a gate of the semiconductor structure, for example, the gate in the transistor. The protective structure is configured to provide isolation protection for the sidewall of the gate layer. The protective structure may include a material with a low dielectric constant or an air gap, to reduce the parasitic capacitance between the gate layer and the side structure (such as a contact plug), thereby improving the electrical performance and yield of the semiconductor structure.

In some embodiments, as shown in FIG. 1 and FIG. 2, the protective structure 42 includes an isolation layer 421 and a protective layer 422.

The isolation layer 421 is provided on the sidewall of the gate layer 41. The isolation layer 421 may be a single layer structure, to ensure the isolation function for the gate layer 41 while reducing the process difficulty. The isolation layer 421 may be a laminated structure. For example, the isolation layer 421 includes a first isolation layer, a second isolation layer, and a third isolation layer (not shown in the figure). The first isolation layer, the second isolation layer, and the third isolation layer may be made of the same material or different materials. In an example, the materials of the first isolation layer, the second isolation layer, and the third isolation layer may each include an isolation material such as silicon dioxide, borophosphosilicate glass, or the like, to isolate the gate layer 41. In another embodiment, the first isolation layer, the second isolation layer and the third isolation layer may include silicon nitride or silicon oxynitride, to improve the isolation performance of the isolation layer 421 and facilitate selective etching in the subsequent structure. In further another embodiment, the first isolation layer, the second isolation layer, the third isolation layer may include a material with a low dielectric constant or an air gap, to reduce parasitic capacitance between the gate layer 41 and the side structure (for example, a contact plug).

The protective layer 422 is provided on the sidewall of the isolation layer 421 and is away from the gate layer 41. The protective layer 422 is configured to protect the external sidewall of the isolation layer 421 and the structure of the gate layer 41, to prevent the gate layer 41 from being damaged in the subsequent process such as etching, and effectively ensure the electrical performance and yield of the semiconductor structure.

The outer edge of the bottom wall of the protective layer 422 is flush with the sidewall of the first dielectric layer 20, to ensure the forming quality of the gate structure and improve the performance of the gate structure. The external sidewall of the protective layer 422 is arc-shaped. The external sidewall with the arc-shaped structure can improve the error tolerance in the subsequent etching process and improve the performance and yield of the semiconductor structure.

Figure 3:
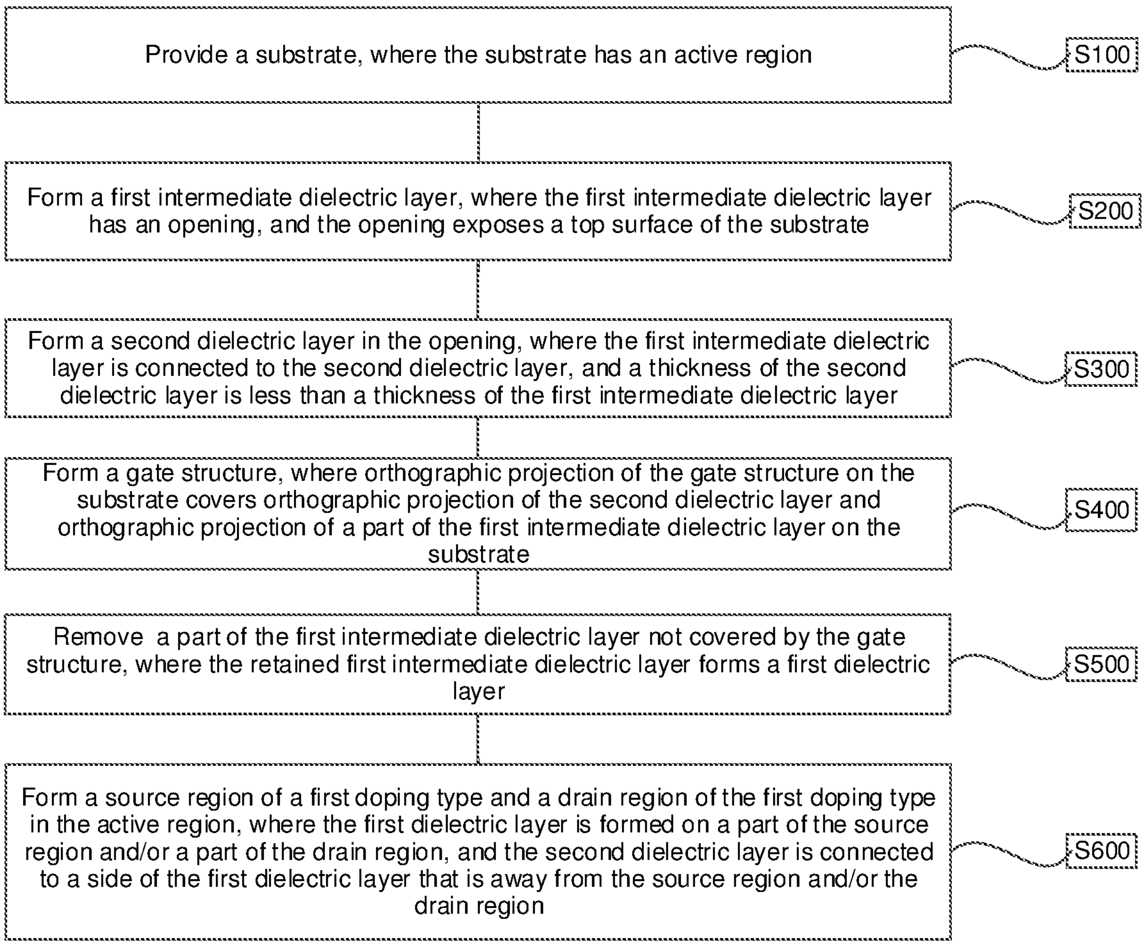
FIG. 3 is a flowchart of a manufacturing method of a semiconductor structure according to an exemplary embodiment.

According to an exemplary embodiment, this embodiment provides a manufacturing method of a semiconductor structure. As shown in FIG. 3, the manufacturing method of a semiconductor structure includes the following steps:

Step S100: Provide a substrate, where the substrate comprises an active region.

Step S200: Form a first intermediate dielectric layer, where the first intermediate dielectric layer has an opening, and the opening exposes a top surface of the substrate.

Step S300: Form a second dielectric layer in the opening, where the first intermediate dielectric layer is connected to the second dielectric layer, and a thickness of the second dielectric layer is less than a thickness of the first intermediate dielectric layer.

Step S400: Form a gate structure, where orthographic projection of the gate structure on the substrate covers orthographic projection of the second dielectric layer and orthographic projection of a part of the first intermediate dielectric layer on the substrate.

Step S500: Remove a part of the first intermediate dielectric layer not covered by the gate structure, where the retained first intermediate dielectric layer forms a first dielectric layer.

Step S600: Form a source region of a first doping type and a drain region of the first doping type in the active region, where the first dielectric layer is formed on a part of the source region and/or a part of the drain region, and the second dielectric layer is connected to a side of the first dielectric layer that is away from the source region and/or the drain region.

In step S100, the substrate 10 is used as a support component of the DRAM to support other components provided thereon. For example, the substrate 10 may be provided with structures such as a word line structure and a bit line structure. The substrate 10 may be made of a semiconductor material. The semiconductor material may be one or more of silicon, germanium, a silicon-germanium compound, and a silicon-carbon compound. In this embodiment, the substrate 10 is made of a silicon material. The use of the silicon material as the substrate 10 in this embodiment is to facilitate the understanding of the subsequent forming method by those skilled in the art, rather than to constitute a limitation. A plurality of active regions 11 are arranged in the substrate 10, and adjacent active regions 11 are separated by a shallow trench isolation structure (not shown in the figure). The channel region 112 is provided in each active region 11.

In this embodiment, the gate structure and the active region are arranged in different layers, the second dielectric layer is arranged between the gate structure and the active region, and the gate structure further covers part of the first dielectric layer. The thickness of the second dielectric layer is less than the thickness of the first dielectric layer, which effectively reduces the parasitic capacitance of the overlapping region between the gate structure and the source region, and/or the overlapping region between the gate structure and the drain, thereby alleviating the GIDL effect of the semiconductor structure, and improving the electrical performance and yield of the semiconductor structure.

According to an exemplary embodiment, this embodiment is a further description of step S200.

Figure 4:
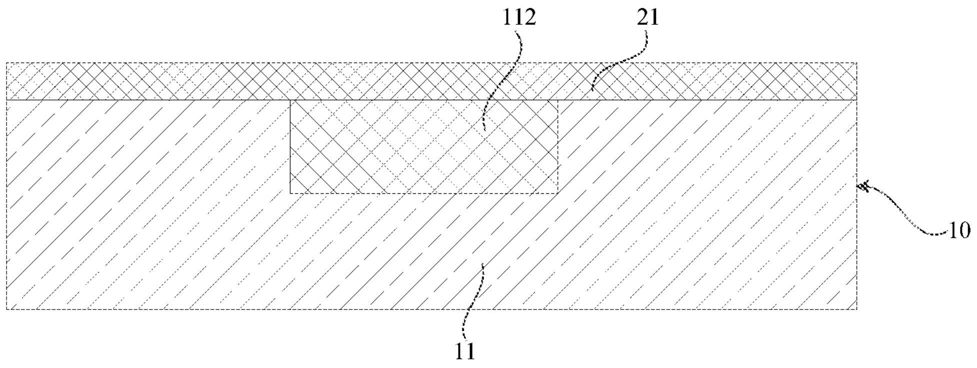
FIG. 4 is a schematic diagram of forming a first initial dielectric layer in a manufacturing method of a semiconductor structure according to an exemplary embodiment.
Figure 5:
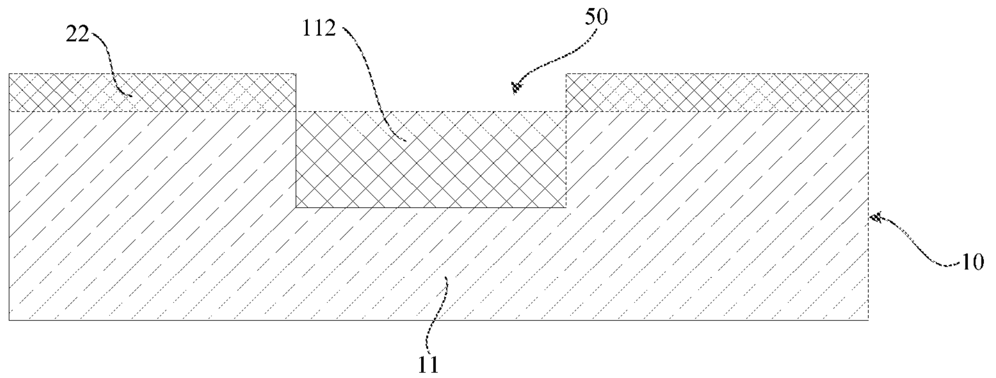
FIG. 5 is a schematic diagram of forming an opening in a manufacturing method of a semiconductor structure according to an exemplary embodiment.

In some embodiments, the first intermediate dielectric layer 22 may be formed by the following method:

First, referring to FIG. 4 and FIG. 5, the first initial dielectric layer 21 is formed on the substrate 10 by an atomic layer deposition process, a physical vapor deposition process, or a chemical vapor deposition process. The first initial dielectric layer 21 covers the top surface of the active region 11. A dielectric constant of the material for forming the first initial dielectric layer 21 is less than 3, or the material of the first initial dielectric layer 21 may include a material with a low dielectric constant, such as silicon nitride, silicon carbonitride, or the like. Moreover, the first initial dielectric layer 21 has a deposition thickness of 3.2 nm to 4.0 nm.

Then, as shown in FIG. 5, after the first initial dielectric layer 21 is formed, a mask layer or photoresist layer is formed on the first initial dielectric layer 21 by an atomic layer deposition process, a physical vapor deposition process or a chemical vapor deposition process. A mask pattern is formed on the photoresist layer through exposure or development etching. By the photoresist layer having the mask pattern as a mask, a part of the first initial dielectric layer 21 is removed through etching, thereby forming the opening 50 in the first initial dielectric layer 21. The opening 50 exposes a part of the top surface of the substrate 10, and the retained first initial dielectric layer 21 forms the first intermediate dielectric layer 22.

This embodiment shows the forming process of the first intermediate dielectric layer; the forming method is simple and easy to control.

Figure 8:
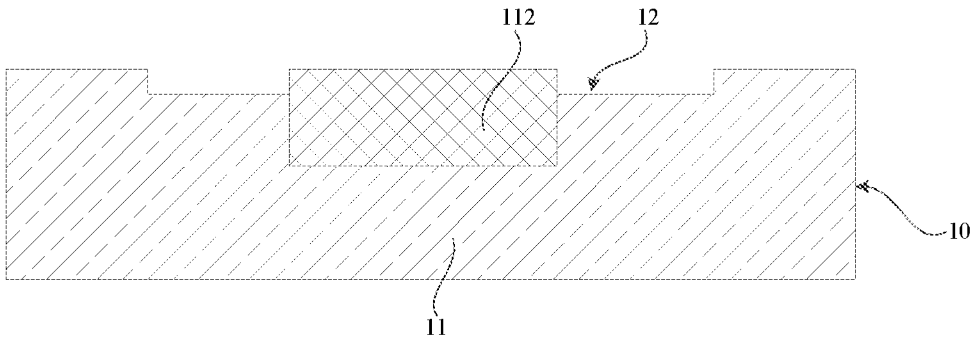
FIG. 8 is a schematic diagram of forming a first groove in a manufacturing method of a semiconductor structure according to an exemplary embodiment.

In some embodiments, the first intermediate dielectric layer 22 may also be formed using the following method:

First, referring to FIG. 8, a first groove 12 is formed in the substrate 10 through an etching process. At least one first groove 12 is provided. The at least one first groove 12 may be located at a side of the channel region 112 and or at both sides of the channel region 112.

Figure 9:
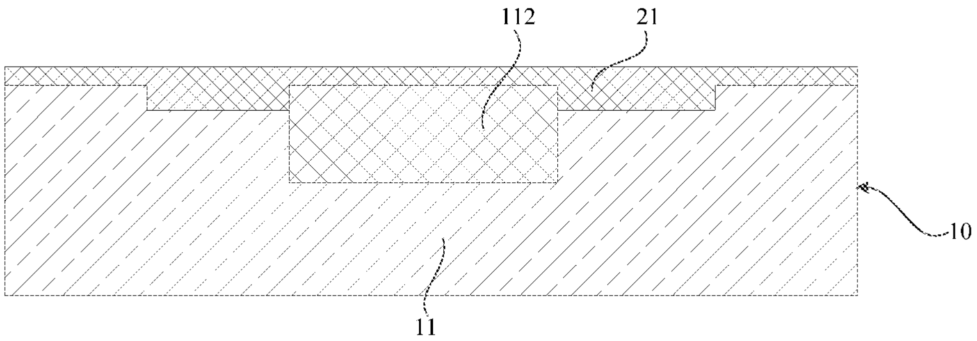
FIG. 9 is a schematic diagram of forming a first initial dielectric layer in a manufacturing method of a semiconductor structure according to an exemplary embodiment.

Then, referring to FIG. 9, the first initial dielectric layer 21 is formed on the substrate 10 by an atomic layer deposition process, a physical vapor deposition process, or a chemical vapor deposition process. The first initial dielectric layer 21 fills up the first groove 12, and extends to the outside of the first groove 12 to cover the top surface of the substrate 10 and the top surface of the channel region 112.

Figure 10:
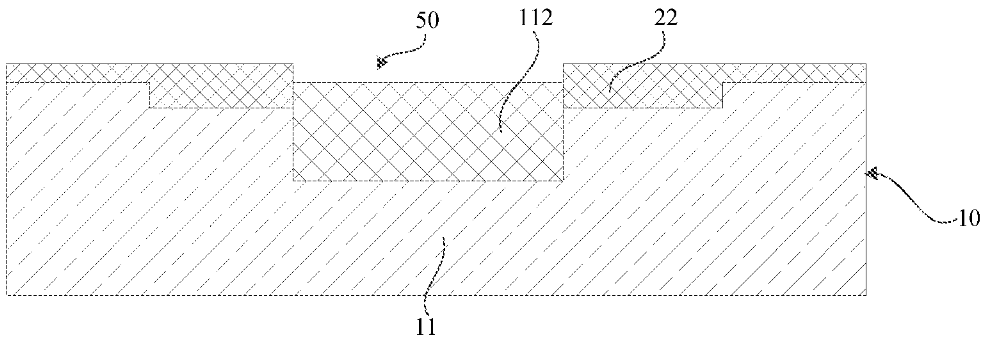
FIG. 10 is a schematic diagram of forming an opening and a first intermediate dielectric layer in a manufacturing method of a semiconductor structure according to an exemplary embodiment.

Then, referring to FIG. 10, the first initial dielectric layer 21 on the top surface of the channel region 112 is removed by an etching process, to form, on the first initial dielectric layer 21, the opening 50 exposing the top surface of the channel region 112. The retained first initial dielectric layer 21 forms the first intermediate dielectric layer 22.

In this embodiment, the formed first intermediate dielectric layer partially extends into the substrate, which can reduce the height of the subsequently formed semiconductor structure and improve the spatial utilization of the semiconductor structure per unit area. Moreover, the first dielectric layer is made of a material with a low dielectric constant, which produces a stress effect for the channel region 112 and improves the electrical performance of the semiconductor structure. For example, for the NMOS, the tensile stress can improve the migration rate of electrons; for the PMOS, the pressure stress can improve the migration rate of holes.

In some embodiments, the first initial dielectric layer 21 may be formed through epitaxial growth. During the epitaxial growth, the substrate 10 will adapt to the growth of the first initial dielectric layer 21, and no new stress is generated between the two. In addition, the growth thickness of the first initial dielectric layer 21 can be controlled flexibly, to provide a good process window for the subsequent process. In addition, there is no stress between the epitaxially grown first initial dielectric layer 21 and the substrate 10, or only tiny stress exists at the interface, thereby improving the stability between the first initial dielectric layer 21 and the substrate 10. It should be noted that, the epitaxial growth process can be adjusted by those skilled in the art according to specific conditions, and details are not described again.

After the first intermediate dielectric layer 22 is formed, the second dielectric layer 30 is formed in the opening 50 by an atomic layer deposition process, a physical vapor deposition process or a chemical vapor deposition process. The deposition thickness of the second dielectric layer 30 ranges from 2.5 nm to 3.1 nm. That is, the deposition thickness of the second dielectric layer 30 is less than the deposition thickness of the first intermediate dielectric layer 22.

According to an exemplary embodiment, this embodiment is a further description of step S300 described above.

Figure 6:
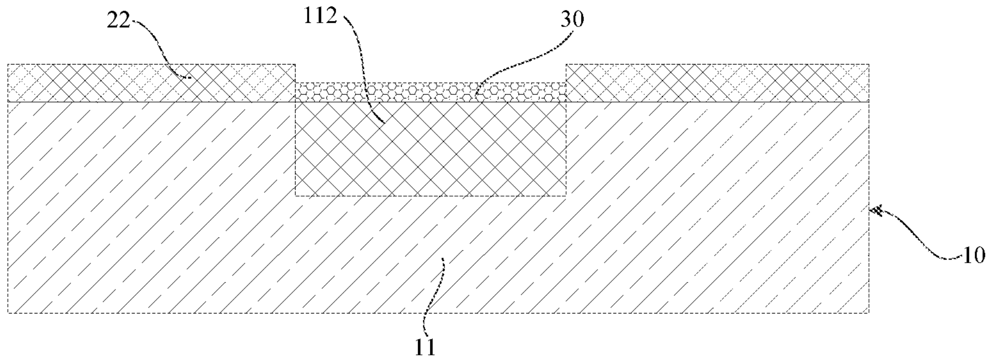
FIG. 6 is a schematic diagram of forming a second dielectric layer in a manufacturing method of a semiconductor structure according to an exemplary embodiment.
Figure 11:
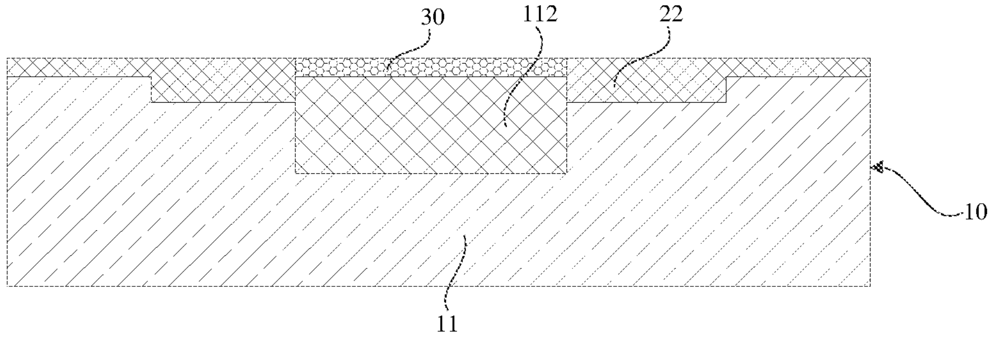
FIG. 11 is a schematic diagram of forming a second dielectric layer in a manufacturing method of a semiconductor structure according to an exemplary embodiment.

In some embodiments, as shown in FIG. 6 and FIG. 11, the second dielectric layer 30 may be formed in the opening 50 through epitaxial growth. During the epitaxial growth of the second dielectric layer 30, the substrate 10 and the first intermediate dielectric layer 22 will adapt to the growth of the second dielectric layer 30, and no new stress is generated between any two of them. In addition, the growth thickness of the second dielectric layer 30 can be controlled flexibly, to provide a good process window for the subsequent process. Thus, there is no stress between the epitaxially grown second dielectric layer 30 and the substrate 10 or the first intermediate dielectric layer 22, or only tiny stress exists at the contact interface between the second dielectric layer 30 and the substrate 10 and the contact interface between the second dielectric layer 30 and the first intermediate dielectric layer 22, to avoid defects or cracks between the first intermediate dielectric layer 22 and the substrate 10 due to the stress, thereby improving the stability of the connection between the substrate 10 and the second dielectric layer 30 and between the substrate 10 and the first intermediate dielectric layer 22.

In an example, the dielectric constant of the material forming the second dielectric layer 30 may be greater than or equal to 3.9. Thus, the dielectric constant of the first intermediate dielectric layer 22 is less than 3, which is different from the dielectric constant of the second dielectric layer 30. For example, the first intermediate dielectric layer 22 is made of a material with a dielectric constant of 3, and the second dielectric layer 30 is made of a material with a dielectric constant of 3.9. According to the calculation formula of the plate capacitance, it may be calculated that the parasitic capacitance between the gate structure 40 and the source region 111, and/or the parasitic capacitance between the gate structure 40 and the drain region 113 can be reduced by 23.1%, thereby effectively shortening the minimum data read time of the semiconductor structure.

According to an exemplary embodiment, this embodiment is a further description of step S400 described above.

Figure 7:
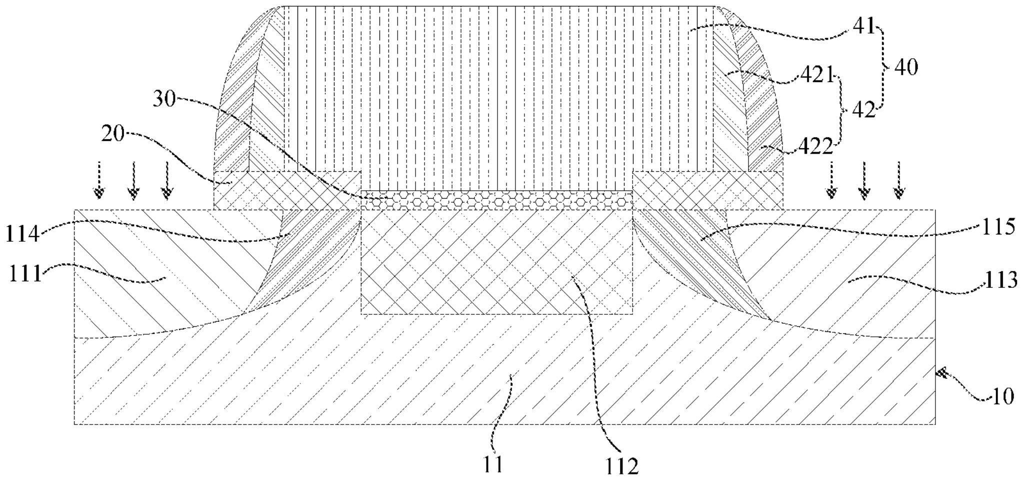
FIG. 7 is a schematic diagram of forming a gate structure in a manufacturing method of a semiconductor structure according to an exemplary embodiment.
Figure 12:
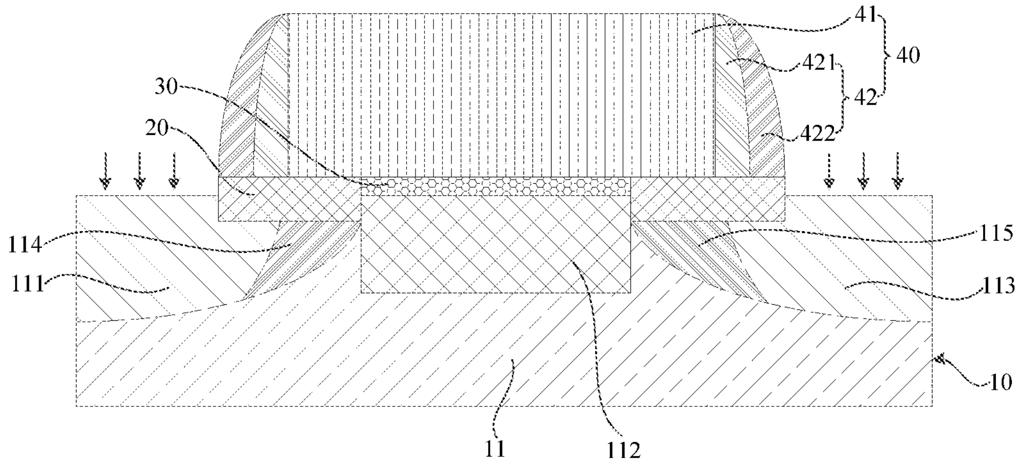
FIG. 12 is a schematic diagram of forming a gate structure in a manufacturing method of a semiconductor structure according to an exemplary embodiment.

As shown in FIG. 7 and FIG. 12, the gate structure 40 may be formed by the following method:

First, a gate layer 41 is formed by an atomic layer deposition process, a physical vapor deposition process or a chemical vapor deposition process. The gate layer 41 covers the top surface of the second dielectric layer 30 and the top surface of part of the first intermediate dielectric layer 22. A material of the gate layer 41 may include, but is not limited to, polysilicon, tungsten, or titanium nitride, etc.

Then, a protective structure 42 is formed on a sidewall of the gate layer 41 through a deposition process (for example, an atomic layer deposition process), where the protective structure 42 covers the side surface of the gate layer 41.

In this embodiment, the gate layer may be configured to form a gate of the semiconductor structure, for example, the gate in the transistor. The protective structure is configured to provide isolation protection for the sidewall of the gate layer. The protective structure may include a material with a low dielectric constant or an air gap, to reduce the parasitic capacitance between the gate layer and the side structure (such as a contact plug), thereby improving the electrical performance of the semiconductor structure.

As shown in FIG. 7 and FIG. 12, the protective structure 42 includes an isolation layer 421 and a protective layer 422. The protective structure 42 may be formed by the following method:

After the gate layer 41 is formed, an isolation layer 421 is formed on two sidewalls of the gate layer 41 by an atomic layer deposition process, a physical vapor deposition process or a chemical vapor deposition process, and a protective layer 422 is formed on the sidewall of the isolation layer 421 and at two sides that are away from the gate layer 41. A material of the isolation layer 421 may include, but is not limited to, a material with a low dielectric constant, an air gap, silicon dioxide, borophosphosilicate glass, silicon nitride or silicon oxynitride.

The isolation layer 421 may be a single layer structure, to ensure the isolation function for the gate layer 41 while reducing the process difficulty.

The isolation layer 421 may alternatively be a laminated structure. For example, the isolation layer 421 includes a first isolation layer, a second isolation layer, and a third isolation layer (not shown in the figure). The first isolation layer, the second isolation layer, and the third isolation layer may be made of the same material or different materials. For another example, materials of the first isolation layer, the second isolation layer, and the third isolation layer each may include an isolation material such as silicon dioxide or borophosphosilicate glass, to isolate the gate layer 41. In another example, the first isolation layer, the second isolation layer and the third isolation layer may include silicon nitride or silicon oxynitride, to improve the isolation performance of the isolation layer 421 and facilitate selective etching in the subsequent structure. In another example, the first isolation layer, the second isolation layer and the third isolation layer may be made of a material with a low dielectric constant, and/or an air gap is provided in the first isolation layer, the second isolation layer, and the third isolation layer, to reduce the parasitic capacitance between the gate layer 41 and the side structure (for example, a contact plug).

In this embodiment, the sidewall of the gate layer is effectively isolated by the isolation layer. The protective layer effectively protects the external sidewall of the isolation layer and the structure of the gate layer, to prevent the gate layer from being damaged in the subsequent process such as etching, and effectively ensure the electrical performance and yield of the semiconductor structure.

As shown in FIG. 7 and FIG. 12, after the protective layer 422 is formed, the protective layer 422 and the isolation layer 421 form the protective structure 42, thereby ensuring the forming quality of the gate structure and improving the performance of the gate structure.

The external sidewalls of the isolation layer 421 and the protective layer 422 are both arc-shaped. The external sidewall with the arc-shaped structure can improve the error tolerance in the subsequent etching process and improve the performance and yield of the semiconductor structure.

In some embodiments, as shown in FIG. 7 and FIG. 12, the isolation layer 421 and the protective layer 422 may be formed by an atomic layer deposition process. The atomic layer deposition process is characterized by a low deposition rate, high density of a deposited film layer, and good step coverage. The isolation layer and the protective layer formed by the atomic layer deposition process can effectively protect the sidewall of the gate layer when the isolation layer and the protective layer are relatively thin, and can avoid occupying a large space, thereby facilitating subsequent implementation of filling or formation of other structure layers.

According to an exemplary embodiment, this embodiment is a further description of step S500 described above.

Part of the first intermediate dielectric layer 22 not covered by the gate structure 40 is removed by an etching process, where the retained first intermediate dielectric layer 22 forms a first dielectric layer 20.

According to an exemplary embodiment, this embodiment is a further description of step S600.

In some embodiments, as shown in FIG. 7 and FIG. 12, the source region 111 of the first doping type and the drain region 113 of the first doping type are formed in the active region 11, where the first dielectric layer 20 is formed on a part of the source region 111 and/or a part of the drain region 113, and the second dielectric layer 30 is connected to a side of the first dielectric layer 20 that is away from the source region 111 and/or the drain region 113.

The source region 111 and the drain region 113 may be formed using the following method:

With the external sidewall of the protective layer 422 as a reference, ion doping of the first doping type is performed on the substrate 10 by a self-alignment process, such that the source region 111 of the first doping type and the drain region 113 of the first doping type are formed in the substrate 10 at two sides of the gate structure 40. The implantation manner of the ion doping for the substrate 10 may further include a first ion implantation and a second ion implantation. In an example, the first source sub-region 114 and/or the first drain sub-region 115 is first formed in the substrate 10 at two sides of the gate structure 40 through first ion implantation, and then the source region 111 of the first doping type is formed at the external side of the first source sub-region 114 and/or the drain region 113 of the first doping type is formed at the external side of the first drain sub-region 115 through second ion implantation. That is, the first source sub-region 114 is located at a side of the source region 111 and is close to the drain region 113, and the first drain sub-region 115 is located at a side of the drain region 113 and is close to the source region 111.

The first dielectric layer 20 is formed on part of the source region 111; or the first dielectric layer 20 is formed on part of the drain region 113; or the first dielectric layer 20 is formed on part of the source region 111 and part of the drain region 113. The second dielectric layer 30 is connected to a side of the first dielectric layer 20 that is away from the source region 111 and/or the drain region 113.

In this embodiment, by a self-alignment process, the first source sub-region and/or the first drain sub-region is formed in the substrate through doping with multiple ion implantations. When the ion doping type of the first source sub-region and/or the first drain sub-region is opposite to that of the source region and the drain region of the first doping type, source-drain breakdown characteristics can be effectively improved; when the ion doping type of the first source sub-region and/or the first drain sub-region is the same as the source region and the drain region of the first doping type, and the ion doping concentration of the first source sub-region and/or the first drain sub-region is lower than that of the source region and the drain region, the leakage current problem of the gate structure can be effectively alleviated, thereby ensuring the stability of the semiconductor structure.

The embodiments or implementations of this specification are described in a progressive manner, and each embodiment focuses on differences from other embodiments. The same or similar parts between the embodiments may refer to each other.

In the description of this specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to understand the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

The invention claimed is:

1. A semiconductor structure, comprising:

a substrate, wherein the substrate comprises an active region, and the active region is provided with a source region of a first doping type and a drain region of the first doping type;

the substrate further comprises at least one of a first source sub-region of the first doping type or a first drain sub-region of the first doping type;

a first dielectric layer, wherein the first dielectric layer is at least partially provided on the substrate, and at least part of the first dielectric layer covers a part of the source region and at least part of the first source sub-region, and/or, at least part of the first dielectric layer covers a part of the drain region and at least part of the first drain sub-region;

a second dielectric layer, wherein the second dielectric layer is provided on the substrate, the first dielectric layer is connected to the second dielectric layer, and a thickness of the second dielectric layer is less than a thickness of the first dielectric layer; and a gate structure, wherein orthographic projection of the gate structure on the substrate covers orthographic projection of the second dielectric layer and orthographic projection of the first dielectric layer on the substrate;

the first dielectric layer is partially provided on the substrate, a top of the first dielectric layer is flush with a top of the second dielectric layer, and a bottom of the first dielectric layer is lower than a bottom of the second dielectric layer.

2. The semiconductor structure according to claim 1, wherein a dielectric constant of the second dielectric layer is greater than or equal to 3.9;

and a dielectric constant of the first dielectric layer is less than 3.

3. The semiconductor structure according to claim 1, wherein the gate structure comprises a gate layer and a protective structure;

the gate layer is provided on the second dielectric layer, and projection of the gate layer on the substrate has an overlapping region with projection of the first dielectric layer on the substrate; and the protective structure is provided on both sides of the gate layer and covers side surfaces of the gate layer.

4. The semiconductor structure according to claim 3, wherein the protective structure comprises an isolation layer and a protective layer;

the isolation layer is provided on a sidewall of the gate layer; and the protective layer is provided on a sidewall of the isolation layer and is away from the gate layer.

5. The semiconductor structure according to claim 1, wherein the substrate further comprises a channel region of a second doping type, the channel region is provided below the gate structure and is connected to the source region and the drain region, and the second dielectric layer covers the channel region.

6. The semiconductor structure according to claim 1, wherein the first source sub-region is located at a side of the source region and is close to the drain region, the first drain sub-region is located at a side of the drain region and is close to the source region, a dopant ion concentration of the first source sub-region is less than a dopant ion concentration of the source region, and a dopant ion concentration of the first drain sub-region is less than a dopant ion concentration of the drain region.

7. A manufacturing method of a semiconductor structure, comprising:

providing a substrate, wherein the substrate comprises an active region;

forming a first intermediate dielectric layer, wherein the first intermediate dielectric layer has an opening, and the opening exposes a part of a top surface of the substrate;

forming a second dielectric layer in the opening, wherein the first intermediate dielectric layer is connected to the second dielectric layer, and a thickness of the second dielectric layer is less than a thickness of the first intermediate dielectric layer;

forming a gate structure, wherein orthographic projection of the gate structure on the substrate covers orthographic projection of the second dielectric layer and orthographic projection of a part of the first intermediate dielectric layer on the substrate;

removing a part of the first intermediate dielectric layer not covered by the gate structure, wherein the retained first intermediate dielectric layer forms a first dielectric layer; and forming a source region of a first doping type and a drain region of the first doping type in the active region, wherein the first dielectric layer is formed on at least one of a part of the source region or a part of the drain region, and the second dielectric layer is connected to a side of the first dielectric layer that is away from at least one of the source region or the drain region;

the first dielectric layer is partially provided on the substrate, a top of the first dielectric layer is flush with a top of the second dielectric layer, and a bottom of the first dielectric layer is lower than a bottom of the second dielectric layer.

8. The manufacturing method of a semiconductor structure according to claim 7, wherein the forming a first intermediate dielectric layer comprises:

forming a first initial dielectric layer on the substrate, wherein the first initial dielectric layer covers the active region; and forming the opening on the first initial dielectric layer through an etching process, wherein the opening exposes a part of the top surface of the substrate, and the retained first initial dielectric layer forms the first intermediate dielectric layer.

9. The manufacturing method of a semiconductor structure according to claim 8, wherein at least one of:

the forming a first initial dielectric layer on the substrate comprises:

forming the first initial dielectric layer through epitaxial growth; or the forming a second dielectric layer in the opening comprises:

forming the second dielectric layer in the opening through epitaxial growth.

10. The manufacturing method of a semiconductor structure according to claim 7, wherein the forming a gate structure comprises:

forming a gate layer, wherein the gate layer covers the second dielectric layer and a part of the first intermediate dielectric layer; and forming a protective structure on a sidewall of the gate layer, wherein the protective structure covers side surfaces of the gate layer.

11. The manufacturing method of a semiconductor structure according to claim 10, wherein the forming a protective structure on a sidewall of the gate layer comprises:

forming an isolation layer on the sidewall of the gate layer; and forming a protective layer on a sidewall of the isolation layer and at two sides of the isolation layer that are away from the gate layer.

12. The manufacturing method of a semiconductor structure according to claim 7, wherein the forming a first intermediate dielectric layer comprises:

forming a first groove in the substrate, and forming the first intermediate dielectric layer in the first groove through deposition, wherein a top surface of the first intermediate dielectric layer is higher than a top surface of the substrate.

13. The manufacturing method of a semiconductor structure according to claim 12, wherein the forming a second dielectric layer in the opening comprises:

forming the second dielectric layer in the opening through deposition, wherein a top surface of the second dielectric layer is flush with the top surface of the first intermediate dielectric layer.

14. The manufacturing method of a semiconductor structure according to claim 7, wherein the forming a source region of a first doping type and a drain region of the first doping type in the active region comprises:

performing ion doping of the first doping type on the substrate by a self-alignment process, such that the source region of the first doping type and the drain region of the first doping type are formed in the substrate at both sides of the gate structure.

15. The semiconductor structure according to claim 5, wherein the first dielectric layer is disposed on both sides of the channel region, the bottom of the first dielectric layer is higher than the bottom of the channel region.

16. The semiconductor structure according to claim 1, wherein the first dielectric layer partially extends into the substrate.

17. The semiconductor structure according to claim 1, wherein a bottom of the second dielectric layer is flush with a top of the substrate.

* * * * *